(12) United States Patent
Zhan et al.

(10) Patent No.: US 10,361,185 B2
(45) Date of Patent: Jul. 23, 2019

(54) ESD PROTECTION DEVICE WITH BURIED LAYER HAVING VARIABLE DOPING CONCENTRATIONS

(71) Applicant: NXP USA, Inc., Austin, TX (US)

(72) Inventors: Rouying Zhan, Gilbert, AZ (US); Chai Ean Gill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 113 days.

(21) Appl. No.: 15/586,843

(22) Filed: May 4, 2017

(65) Prior Publication Data

US 2017/0236817 A1    Aug. 17, 2017

Related U.S. Application Data

(62) Division of application No. 13/917,580, filed on Jun. 13, 2013, now Pat. No. 9,659,922.

(51) Int. Cl.
| | | |
|---|---|---|
| H01L 27/02 | (2006.01) |
| H01L 29/10 | (2006.01) |
| H01L 21/84 | (2006.01) |
| H01L 27/12 | (2006.01) |
| H01L 29/06 | (2006.01) |
| H01L 29/08 | (2006.01) |

(Continued)

(52) U.S. Cl.
CPC .......... *H01L 27/0262* (2013.01); *H01L 21/84* (2013.01); *H01L 27/1203* (2013.01); *H01L 29/0649* (2013.01); *H01L 29/0804* (2013.01); *H01L 29/1083* (2013.01); *H01L 29/1095* (2013.01); *H01L 29/36* (2013.01); *H01L 29/66234* (2013.01); *H02H 9/046* (2013.01)

(58) Field of Classification Search
CPC ............... H01L 27/0259; H01L 27/082; H01L 27/0821; H01L 27/0823; H01L 23/60; H01L 27/0248; H01L 29/0821; H01L 29/0826; H01L 29/73; H01L 29/732; H01L 29/7322; H01L 2924/1305; H01L 29/107; H01L 29/70
See application file for complete search history.

(56) References Cited

U.S. PATENT DOCUMENTS 6,441,437 B1 *  8/2002  Gossner .............. H01L 27/0248
                                                          257/355
8,154,049 B2     4/2012  Albers et al.
(Continued)

*Primary Examiner* — Cheung Lee

(57) ABSTRACT

An electrostatic discharge protection clamp includes a substrate and a first electrostatic discharge protection device over the substrate. The first electrostatic discharge protection device includes a buried layer over the substrate. The buried layer has a first region having a first doping concentration and a second region having a second doping concentration. The first doping concentration is greater than the second doping concentration. The first electrostatic discharge protection device includes a first transistor over the buried layer. The first transistor has an emitter coupled to a first cathode terminal of the electrostatic discharge protection clamp. The first electrostatic discharge protection device includes a second transistor over the buried layer. The second transistor has an emitter coupled to a first anode terminal of the electrostatic discharge protection clamp. A collector of the first transistor and a collector of the second transistor are over the first region of the buried layer.

16 Claims, 5 Drawing Sheets

(51) Int. Cl.
*H01L 29/36* (2006.01)
*H01L 29/66* (2006.01)
*H02H 9/04* (2006.01)

(56) References Cited

U.S. PATENT DOCUMENTS

| | | |
|---|---|---|
| 8,994,068 B2 | 3/2015 | Zhan et al. |
| 2010/0314712 A1 | 12/2010 | Arai et al. |
| 2011/0176244 A1 | 7/2011 | Gendron et al. |
| 2014/0111892 A1* | 4/2014 | Chen .................. H01L 27/0262 |
| | | 361/56 |

* cited by examiner

ESD PROTECTION DEVICE WITH BURIED LAYER HAVING VARIABLE DOPING CONCENTRATIONS

RELATED APPLICATION

This application is a divisional of co-pending U.S. patent application Ser. No. 13/917,580, filed on Jun. 13, 2013.

FIELD OF USE

The present disclosure relates generally to semiconductor devices, and more specifically, to semiconductor devices providing protection from electrostatic discharge (ESD).

BACKGROUND

Modern integrated circuits (ICs) and electronic assemblies, and the devices therein, are at risk of damage due to electrostatic discharge (ESD) events. Accordingly, it is commonplace to provide an ESD protection clamp across the terminals of such devices, IC's and electronic circuits or assemblies. As used herein, the term integrated circuit and the abbreviation IC are intended to refer to any type of circuit or electronic assembly whether formed in a monolithic substrate or as individual elements or a combination thereof.

ESD protection clamps are circuit elements used to protect IC devices from voltage and current spikes that may be associated with an electrostatic discharge. To protect an IC device, an ESD clamp is connected between an input or output terminal of the IC device and a ground or common terminal. During normal operation, the ESD clamp does not conduct. But when subjected to an excessive voltage, the ESD clamp becomes conductive, conducting current to ground and limiting voltage across the IC device to a desired safe level, thereby protecting the IC to which the ESD clamp is connected. Generally, the ESD will turn on or become conductive at a voltage that is above the DC operating voltage of IC device, but below the IC device's breakdown voltage.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

Figure 1:
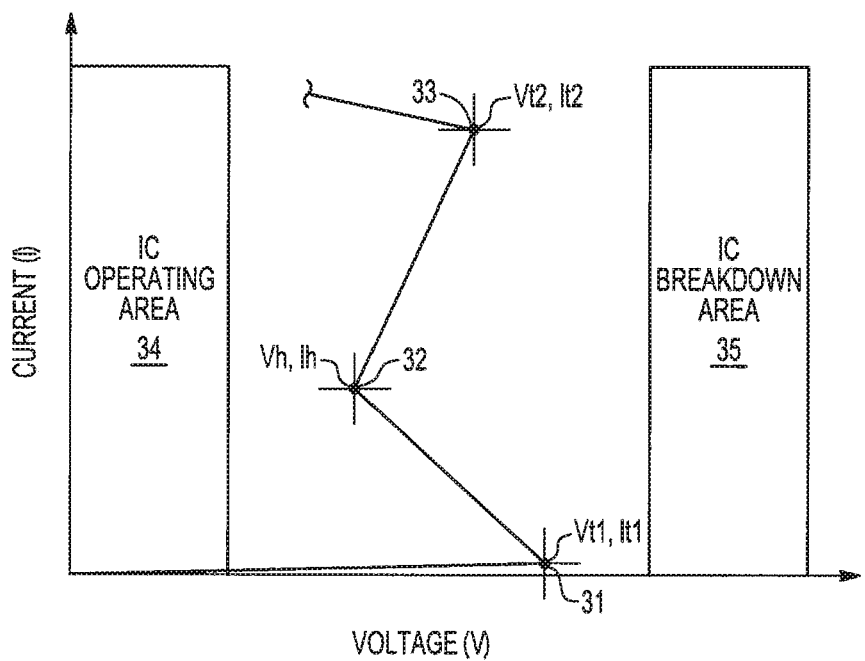
FIG. 1 is a graph showing a transmission line pulse (TLP) current (I) versus voltage (V) for a typical electrostatic discharge (ESD) protection device.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

In one implementation, the disclosure provides an electrostatic discharge protection clamp adapted to limit a voltage appearing across protected terminals of an integrated circuit to which the electrostatic discharge protection clamp is configured to be coupled. The electrostatic discharge protection clamp includes a substrate and a first electrostatic discharge protection device over the substrate. The first electrostatic discharge protection device includes a buried layer over the substrate. The buried layer has a first region having a first doping concentration and a second region having a second doping concentration. The first doping concentration is greater than the second doping concentration. The first electrostatic discharge protection device includes a first transistor over the buried layer. The first transistor has an emitter coupled to a first cathode terminal of the electrostatic discharge protection clamp. The first electrostatic discharge protection device includes a second transistor over the buried layer. The second transistor has an emitter coupled to a first anode terminal of the electrostatic discharge protection clamp. A collector of the first transistor and a collector of the second transistor are over the first region of the buried layer.

In another implementation, the present disclosure provides a method including providing a substrate including a buried layer. The buried layer has a first region having a first doping concentration and a second region having a second doping concentration. The first doping concentration is greater than the second doping concentration. The method includes forming a first transistor over the buried layer. The first transistor has an emitter coupled to a first cathode terminal of the electrostatic discharge protection clamp. The method includes forming a second transistor over the buried layer. The second transistor has an emitter coupled to a first anode terminal of the electrostatic discharge protection clamp. A collector of the first transistor and a collector of the second transistor are formed over the first region of the buried layer. The present ESD clamp can be connected across any terminals or pins of an IC device that constitutes the electronic device to be protected. Accordingly, any reference herein to a particular input or output terminal of an IC device is intended to include any and all other terminals of electronic circuits, not merely those used for input or output signals. With respect to structures or elements used for ESD protection, the terms device, clamp and transistor are used interchangeably.

FIG. 1 is a graph showing a transmission line pulse (TLP) current (I) versus voltage (V) for an electrostatic discharge (ESD) protection device. In operation, as the transient voltage applied to the terminals is increased, very little current flows through the ESD protection device until the triggering voltage Vt1 at point 31 is reached. It should be noted that within the present disclosure the value Vt1 refers to forward triggering voltage, unless otherwise specified. With the increased current, the device reaches a snapback point or holding point indicated by point 32 of FIG. 1. At point 32, the voltage across the ESD protection device is Vh and the current flowing through the device is Ih.

After the device's holding voltage and current (Vh, Ih) are reached, current and voltage may further increase to point 33 at current It2 and voltage Vt2, beyond which destructive failure may occur leading to further current increase accompanied by voltage decrease. Generally, It2 indicates the current capability of the ESD protection device before the device is thermally damaged.

As illustrated in FIG. 1, therefore, the ESD structure's transient I-V curve fits within an ESD design window between the IC's normal operating area including the range of I-V values indicated by element 34 and the breakdown area including the range of I-V values indicated by element 35.

ESD protection devices are generally non-conductive during normal operation of the connected IC device being protected. However, when the connected IC device is subjected to an excessive voltage that is similarly subjected to the ESD protection device, the ESD protection device turns on, becoming conductive and thereby preventing damage to the protected device. The triggering voltage Vt1 of the ESD protection device is generally selected to exceed the maximum normal DC operating voltage of the protected device. Additionally, Vt1 is selected to be less than the lowest transient voltage that may cause damage to the protected device. When protecting a device having a number of terminals, ESD protection devices may be connected across each terminal and a ground terminal to provide comprehensive protection to the IC device.

In some implementations, it is desirable that an ESD device have a relatively high holding voltage (Vh) and a relatively low resistance when turned on (Ron). Ron is reflected in FIG. 1 in the slope of the line between points 32 and 33. The closer to vertical the line between points 32 and 33, the lower the device's Ron. In an ESD device, a relatively high holding voltage (Vh) provides good latch-up immunity for the ESD device. A relatively low Ron, reflected in Vt2 being a voltage that is relatively close to the voltage Vh, provides that the voltage clamped by the device is at a safe level below the IC breakdown voltage.

In conventional devices, the Ron value of an ESD device can be reduced by increasing the size of ESD device. This limitation can result in ESD structures having a necessarily large footprint in order to meet current capability (It2) requirements, while ensuring sufficient margin between the clamping voltage at specific compliance and IC breakdown voltage requirements.

Example models that establish performance requirements for ESD devices include the human body model (HBM), and machine model (MM). These models define standard waveforms that are used to electrically stress a device under ESD testing. These testing waveforms are usually defined by their peak current level, rise and fall times, and duration. The HBM simulates a charged human discharging into an IC device being protected. The HBM testing waveform usually has a rise time of about 10 ns, and a fall time of about 150 ns. At a 2 KV stress level, the model calls for a peak current Ipeak=~1.33 A. The MM model simulates charging due to machine handling. An MM ESD test signal generates a sinusoidal decaying waveform with a rise time of about 5 ns-10 ns. At a 200V stress level, the model calls for a peak current Ipeak=~3.5 A. Generally commercial parts are required to sustain at least 2 KV HBM and 200V MM.

Figure 2:
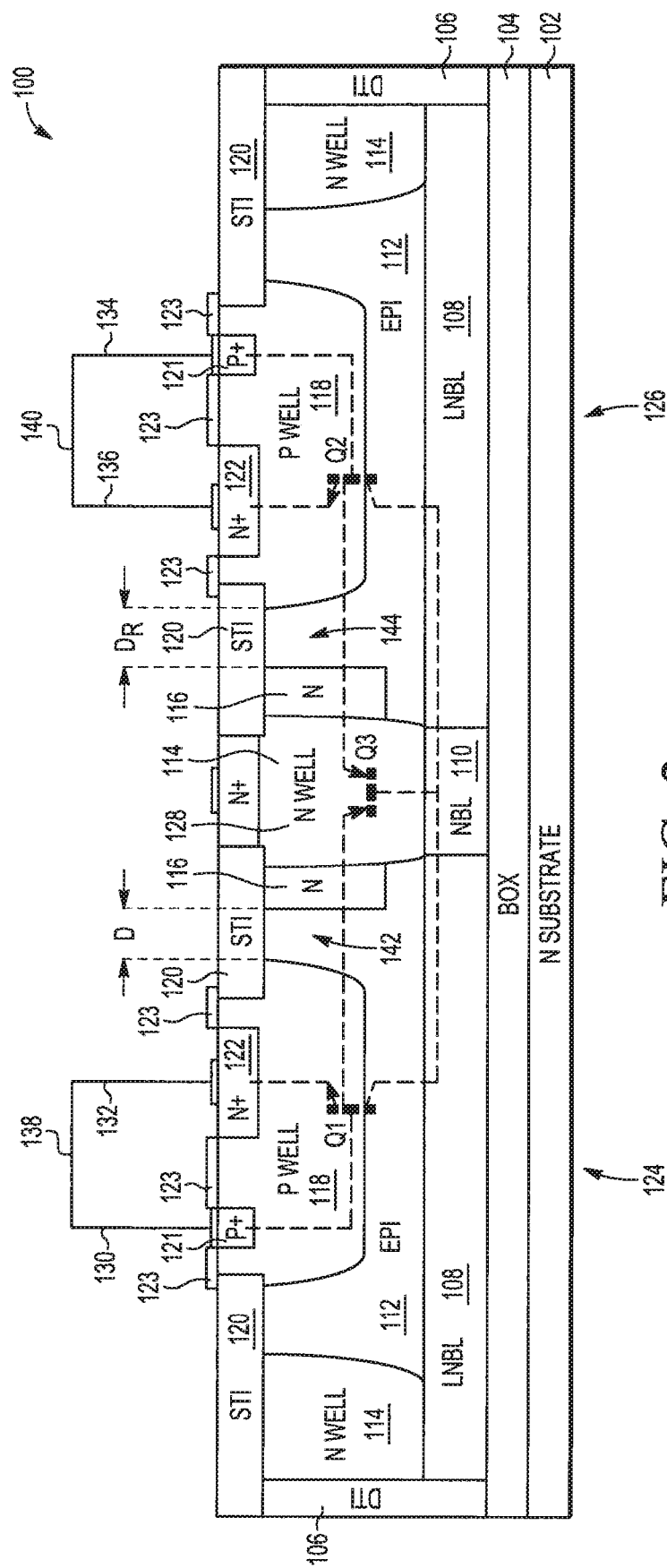
FIG. 2 is a cross-sectional view of an ESD protection device implemented in a semiconductor substrate according to an embodiment of the present disclosure.

FIG. 2 is a cross-sectional view of ESD protection device 100 implemented in a semiconductor substrate according to an embodiment of the present invention. ESD protection device is a dual polarity or bi-directional ESD clamp device and may be used in protecting electronic devices and circuits. As described below, the ESD protection device includes two mirrored and interconnected transistors 124 and 126 and may be incorporated into an ESD protection clamp.

ESD protection device 100 is formed over substrate 102. Substrate 102 is provided with buried oxide layer (BOX) 104. Depending upon the implementation, substrate 102 may be either of N-type or P-type. Buried oxide layer 104 provides electrical isolation to devices formed over substrate 102. In various implementations, however, buried oxide layer 104 is optional and need not be provided.

N-type or, alternatively, P-type, buried layer (NBL) regions 108 and 110 are formed over buried oxide layer 104. NBL regions 108 and 110 may be doped with antimony, phosphorus, or suitable combinations thereof. NBL regions 108 and 110 may have a thickness (t) in the range of 1 micrometer (μm) to about 4 μm, and are located at a depth below the surface of ESD protection device 100 ranging from about 2 μm to 6 μm. But other dopants, concentrations, thicknesses and depths may also be used. NBL region 110 is doped at a first doping concentration, while NBL regions 108 are lightly doped (i.e., a light NBL (LNBL) region) in comparison to NBL region 110. Accordingly, NBL regions 108 may also be referred to herein as LNBL regions 108. In one implementation LNBL regions 108 have a peak doping concentration of about $2\times10^{16}$ per cubic centimeter ($cm^{-3}$). In other implementations, the doping concentration of LNBL regions 108 may range from about $1\times10^{16}$ $cm^{-3}$ to $5\times10^{17}$ $cm^{-3}$, while NBL region 110 has a peak doping concentration of about $1\times10^{18}$ $cm^{-3}$ to about $1\times10^{19}$ $cm^{-3}$. In another implementation, the doping concentration of LNBL regions 108 is approximately 10 times less than that of NBL region 110. NBL region 110 may be formed, for example, as an NBL region overlapped with an LNBL region.

NBL regions 108 and 110 can be formed using any suitable process.

Region 112 is formed over NBL regions 108 and 110. In one implementation, region 112 is formed by epitaxial deposition and may be either N-type or a P-type doped (P-type is shown in FIG. 2). An example doping concentration range of region 112 is about $1\times10^{15}$ $cm^{-3}$ to about $8\times10^{15}$ $cm^{-3}$. As such, region 112 may be relatively lightly doped. The depth of region 112 from the top surface of device 100 to the top surface of BOX layer 104 is usually in the range of 2 μm to about 6 μm in some embodiments.

Within region 112, a number of N-well regions 114 are formed. N well regions 114 may be doped with arsenic, phosphorus, antimony, or suitable combinations thereof. The outermost regions 114 form sidewalls that surround the ESD device 100 formed over substrate 102. The peak doping density for N-well regions 114 is usually in a range of about $1\times10^{17}$ $cm^{-3}$ to about $1\times10^{19}$ $cm^{-3}$ although other doping densities may also be used. N-well regions 114 are formed to be in contact and, therefore, in electrical communication with LNBL 108 or NBL 110. In one implementation, the doping density of N-well regions 114 is approximately the same as the doping density of NBL region 110.

A number of shallow trench isolation (STI) structures 120 are formed over a surface of device 100. The depth of STI structures 120 is usually in the range of about 0.05 μm to about 1 μm, more conveniently about 0.2 μm to about 0.5 μm, although thicker or thinner STI structures may also be used.

To fully isolate devices formed over substrate 102, deep trench isolation (DTI) regions 106 are formed to provide electrically insulating walls around the devices. DTI regions 106 comprise dielectric materials that provide lateral electrical isolation to the device. Deep trench isolation regions are provided extending from surface to buried oxide layer 104.

N-type regions 116 are formed in communication with N-well regions 114. N-type regions 116 may be doped with arsenic, phosphorus, or suitable combinations thereof at a peak concentration that is equal to, or lighter than, the doping of N-well regions 114. The depth of N-type regions 116 may be in the range of 0.3 μm from the surface of device 100, to any location above or in contact with NBL 108, but other depths may also be used.

P-well regions 118 are formed within region 112. P-well regions 118 may be doped with boron or other suitable dopants. The peak doping density for P-well regions 118 is in the range of about $1\times10^{16}$ $cm^{-3}$ to about $1\times10^{19}$ $cm^{-3}$. The depth of P-well regions 118 may be in the range of 0.3 μm from the surface of device 100, to any location above or in contact with NBL 108, but other depth may also be used.

A number of silicide block regions 123 can be formed over the surface of device 100 to prevent reaction with a silicide-forming conductor that may be deposited over the device at a later time. In one embodiment, the silicide block regions 123 comprise a first layer of silicon oxide overlaying the surface, followed by a second layer of silicon nitride overlapping the first layer. While in another embodiment, the silicide block regions 123 may be omitted. In some cases, the silicide block regions 123 are replaced using shallow trench isolation (STI).

N+ doped contact regions 122 are formed in P-well regions 118. N+ contact regions 122 include relatively shallow, but highly doped N-type regions and may include phosphorus, arsenic, or suitable combinations thereof as dopants. The peak doping density for N+ contact regions 122 can be in the range of about $5\times10^{19}$ $cm^{-3}$ to about $1\times10^{21}$ $cm^{-3}$. The depth of N+ contact regions 122 can range from about 0.05 μm to about 0.3 μm. Other dopants, density and depths, though, may also be used.

P+ doped contact regions 121 are formed in P-well regions 118 to make electrical contact with P-well regions 118. P+ contact regions 121 include relatively shallow, but highly doped P regions and may include boron as a dopant. The peak doping density for P+ contact regions 121 is in the range of about $5\times10^{19}$ $cm^{-3}$ to about $1\times10^{21}$ $cm^{-3}$. The depth of P+ contact regions 120 can range from about 0.05 μm to about 0.3 μm. But other dopants, density and depths may also be used.

Figure 3:
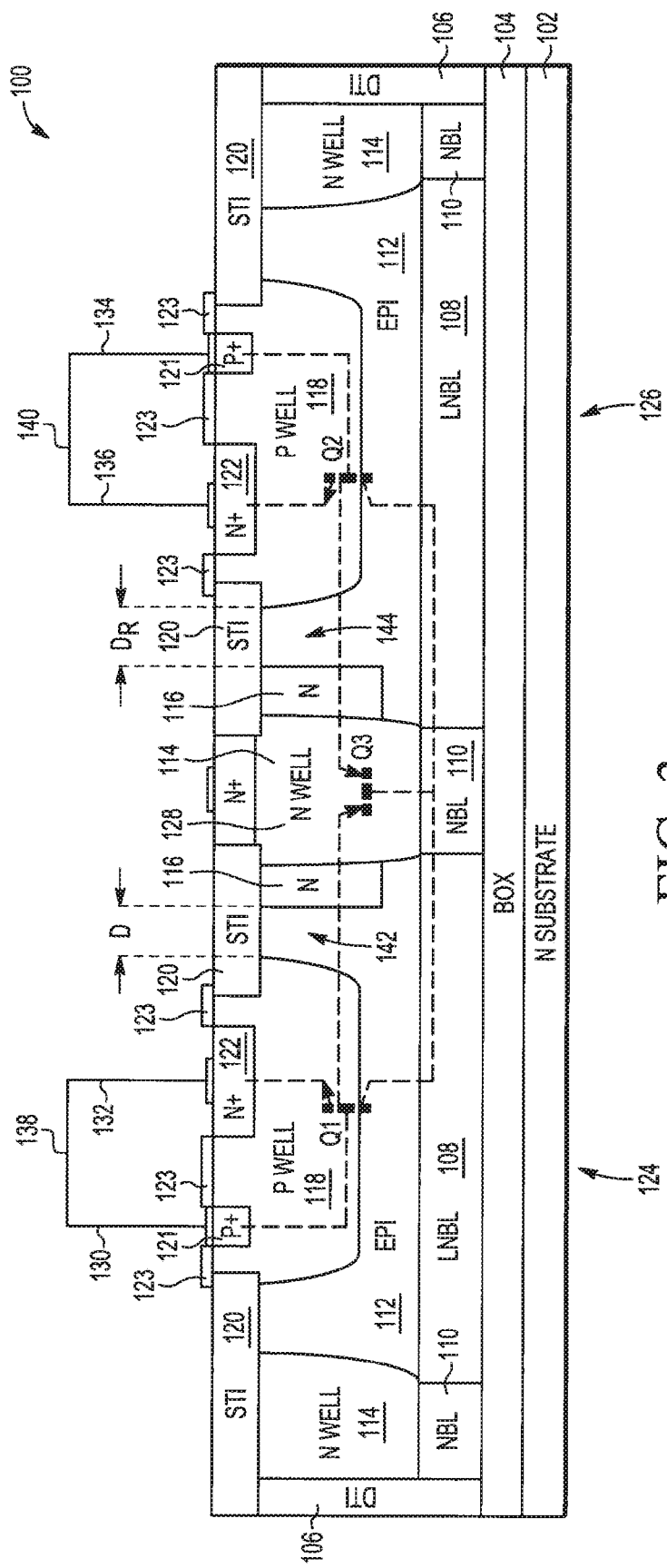
FIG. 3 is a cross-sectional view of an ESD protection device implemented in a semiconductor substrate according to another embodiment of the present disclosure.

In some implementations of ESD device 100, additional NBL regions may be formed under some or all of N well regions 114. FIG. 3, for example, is a cross-sectional view of an alternative implementation of ESD protection device 100 including additional NBL regions formed over substrate 102. As depicted in FIG. 3, NBL regions 108 are formed under each of N well regions 114. In FIG. 3, the structure of ESD device 100 is the same as that depicted in FIG. 2, but with NBL regions 110 formed under each of N well regions 114. In FIG. 3, NBL regions 110 are more highly doped than lightly doped NBL regions 108. Depending upon the implementation, each of NBL regions 110 may all be doped at approximately the same density. In other implementations, though, the doping of the central NBL region 110 may be doped at a higher density, while the doping concentration of NBL regions 110 under the outermost N well regions 114 may be at a level that falls between the doping concentration of the central NBL 110 and LNBL regions 108.

In other implementations, the LNBL region 108 on the left side of the device (i.e., LNBL region 108 under device Q1) may have a different doping concentration from the LNBL region 108 on the right side of the device (i.e., LNBL region 108 under device Q2). For example, device 100 may include an NBL region that is normally-doped formed under the anode of device 100, while the region under the cathode of device 100 may include a lightly-doped NBL (i.e., LNBL). In such a configuration the device may provide an improved holding voltage Vh, while having a slightly increased Ron that a symmetrical device.

Returning to FIG. 2, the structure forms two NPN bipolar junction transistors 124 and 126. To illustrate the location and electrical interconnection of transistors 124 and 126 within the device, FIG. 2 includes a dashed schematic overlay showing the approximate location of a number of transistor structures within device 100. In the overlay, transistor 124 is represented by transistor Q1 and transistor 126 is represented by transistor Q2. In FIG. 2, transistors Q1, Q2, and Q3, described below, and their interconnections are only included for reference and do not form any portion of the structure of device 100. In FIG. 2, N+ doped regions 122 serve as the emitters of transistors 124 and 126. P-well regions 118 serve as the bases of transistors 124 and 126. The N-well region 128 and connected NBL region 110 serve as the shared collector of transistors 124 and 126. The base and emitter terminals 130 and 132, respectively, of transistor 124 are tied together to form cathode terminal 138 for ESD protection device 100. The base and emitter terminals 134 and 136, respectively, of transistor 126 are tied together to form anode 140 terminal for ESD protection device 100.

In this configuration, a parasitic PNP transistor structure is formed in device 100 at the approximate location of transistor Q3 on FIG. 2. N-well region 128 and the adjoining NBL region 110 serve as the base of the transistor structure Q3, and P-well regions 118 serve as the emitter and collector of transistor structure Q3.

If a positive voltage is applied to terminal 140 with respect to terminal 138, then transistor 126 acts as a forward-biased diode, and transistor 124's base-collector junction is reverse biased. When a sufficiently large voltage is applied to terminal 140 with respect to terminal 138, intermediate portion 142 of region 112 becomes depleted of free carriers and distance D represents the base-collector spacing. As the applied voltage increases to Vt1, avalanche breakdown occurs across distance D in portion 142 of region 112. Thus, the forward triggering voltage Vt1 at which avalanche breakdown occurs in transistor 124 can depend upon triggering spacing dimension D between P-well 118 and N-type region 116 within transistor 124; the larger spacing dimension D, the higher Vt1 and, conversely, the smaller spacing dimension D, the smaller Vt1. As the applied voltage increases above Vt1, the avalanche breakdown generates carriers turning on NPN transistor 124 (Q1). NPN transistor 124 (Q1) then couples with PNP transistor structure Q3 so that the base of transistor 124 (Q1) also serves as and connects to the collector of transistor structure Q3, and the collector of transistor 124 (Q1) serves as and connects to the base of transistor structure Q3. The coupling between transistor 124 and transistor structure Q3 forms a parasitic silicon controlled rectifier (SCR). The parasitic SCR effects provide strong current capability for the present device after the device snaps back and begins conducting.

After snapback, a significant amount of current flows vertically from LNBL region 108 to the emitter of Q1 formed by N+ doped contact region 122 of Q1. Because LNBL region 108 of Q1 is lightly doped, current flow and field distribution through Q1 is modulated to increase Vh and reduce Ron for the device 100. However, for Q3, NBL region 110, operating as the base of Q3, is more heavily doped than LNBL regions 108 resulting in a larger effective base width (Wb) for Q3, thus reducing current gain and increasing Vh for the device 100. Consequently, a combination of lightly doped LNBL regions 108 and NBL region 110 increases Vh and reduces Ron for device 100.

Conversely, when a negative voltage is applied to terminal 140 with respect to terminal 138, then transistor 124 acts as a forward-biased diode and transistor 126's base-collector junction is reverse biased. When a negative voltage with sufficiently large amplitude is applied to terminal 138 with respect to terminal 140, intermediate portion 144 of region 112 becomes depleted of free carriers and distance $D_R$ represents the base-collector spacing. As the applied voltage increases to $Vt1_R$, avalanche breakdown occurs across distance $D_R$ in portion 144 of region 110. Thus, the reverse triggering voltage $Vt1_R$ at which avalanche breakdown occurs in transistor 126 can depend upon reverse triggering spacing $D_R$ between P-well 118 and N-type region 116 within transistor 126; the larger spacing dimension $D_R$, the higher $Vt1_R$ and, conversely, the smaller spacing dimension $D_R$, the smaller $Vt1_R$. As the applied voltage increases above $Vt1_R$, the avalanche breakdown generates carriers to turn on NPN transistor 126 (Q2). NPN transistor 126 (Q2) then couples with PNP transistor structure Q3 in a way that the base of transistor 126 (Q2) also serves as and connects to the collector of transistor structure Q3, and the collector of transistor 126 (Q2) serves as and connects to the base of Q3. The coupling between transistor 126 and transistor structure Q3 also forms a parasitic SCR. The parasitic SCR effects provide strong reverse current capability for the present device after the device snaps back and starts conducting.

After snapback, a significant amount of current flows vertically from LNBL region 108 to the emitter of Q2 formed by N+ doped contact region 122 of Q2. Because LNBL region 108 of Q2 is lightly doped, current flow and field distribution through Q2 is modulated to increase Vh and reduce Ron for the device 100. However, for Q3, NBL region 110, operating as the base of Q3, is more heavily doped than LNBL regions 108 resulting in a larger Wb for Q3, thus reducing current gain and increasing Vh for the device 100. Consequently, a combination of lightly doped LNBL regions 108 and NBL region 110 increases Vh and reduces Ron for device 100.

The forward and reverse triggering voltages Vt1 and $Vt1_R$ may be substantially the same or different depending on whether forward and reverse triggering spacing D and $D_R$ are substantially the same or different.

A number of ESD devices can be stacked to create a single stacked ESD device having an increased trigger voltage (Vt1) and holding voltage (Vh). When stacked within a single ESD protection clamp device, two or more ESD protections devices can be formed next to one another in a single substrate, for example. The individual ESD protection devices are then electrically connected in series or stacked with the cathode of one ESD protection device being electrically connected to the anode of the next ESD device. The anode of the first ESD protection device in the stack provides a positive input or anode terminal for the stacked ESD protection clamp. Similarly, the cathode of the last ESD protection device in the stack provides a negative input or cathode terminal for the ESD protection clamp. The positive and negative input terminals of the ESD protection clamp can then be connected to an IC device to provide protection thereto.

Figure 4A:
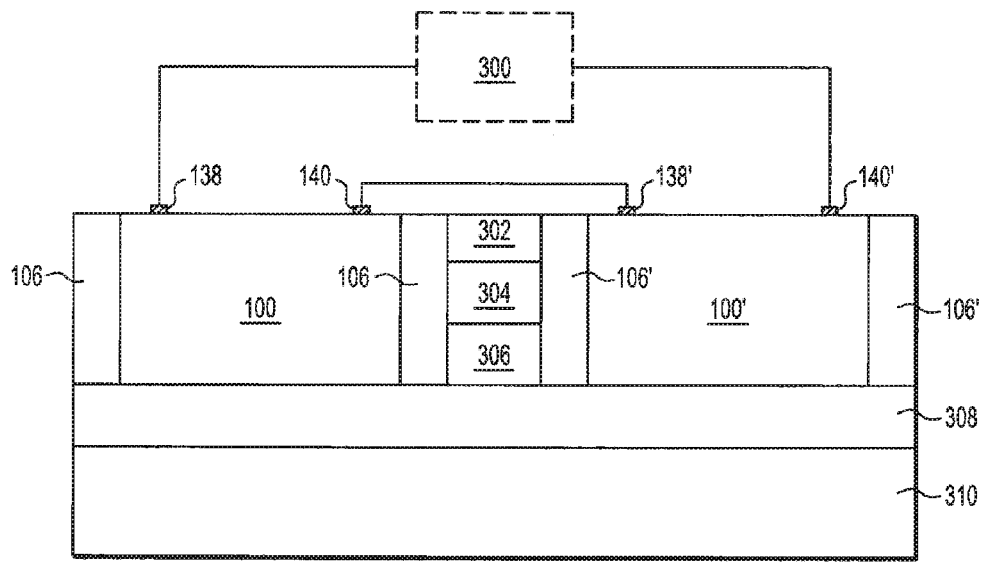
FIGS. 4A and 4B show cross-sectional views of an electrostatic discharge protection clamp including two stacked ESD protection devices.
Figure 4B:
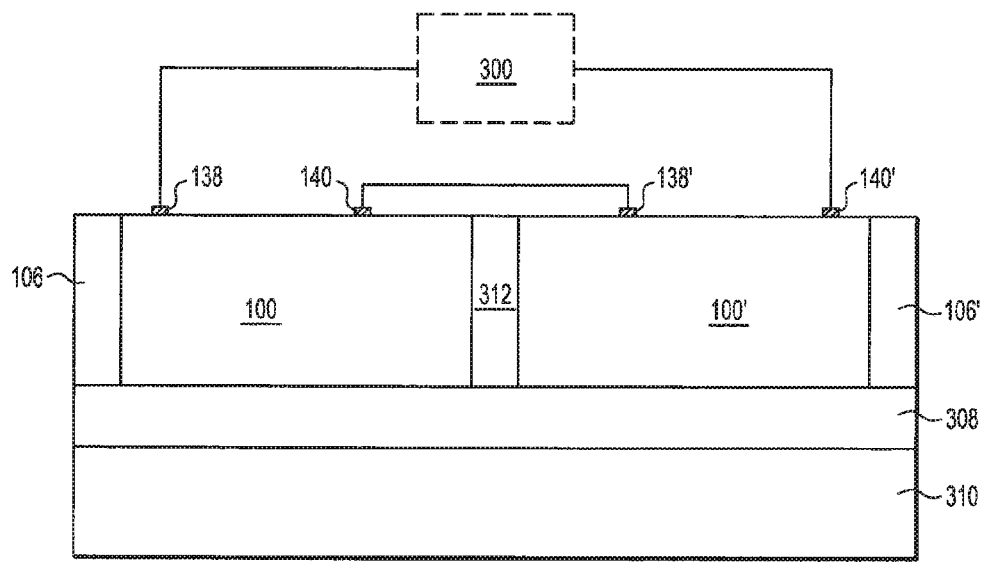

FIGS. 4A and 4B, for example, are cross-sectional views of an ESD protection clamp that includes two stacked ESD protection devices. In FIG. 4A two ESD protection devices 100 and 100' are connected in series, though other devices or clamps could include more than two series-connected ESD protection devices. In the arrangement shown in FIG. 4A, device 100' is the first ESD protection device in the stacked device and device 100 is the second ESD protection device.

Each of devices 100 and 100' in FIG. 4A can be configured in accordance with the example device 100 shown in FIGS. 2 and/or 3, however, the DTI regions 106 of each device have been duplicated in FIG. 4A. FIG. 4A also shows the substrate 310 and optional BOX layer 308 over which each ESD protection device is formed.

Each of the devices 100 and 100' are electrically isolated by DTI regions 106 from N type or P type region 306, which may be formed by epitaxial deposition, and, in some embodiments, P well region 304. In FIG. 4A, DTI regions 106 surround device 100 and DTI regions 106' surround device 100'. STI structure 302 is provided for additional isolation.

To interconnect the devices, cathode 138' of device 100' is connected to anode 140 of device 100, thereby connecting devices 100 and 100' in series. The anode 140' of device 100' is connected to a first terminal (e.g., a positive terminal Vpos) of IC device 300. The cathode 138 of the stacked ESD protection device 100 is connected to a second terminal (e.g., a negative terminal Vneg) of IC device 300. In this configuration, the stacked ESD protection devices 100 and 100' operate as an ESD protection clamp to provide protection to IC device 300.

FIG. 4B is a cross-sectional view showing two stacked ESD protection devices 100 and 100', where the devices are isolated from one another using an alternative trench structure. In FIG. 4B, devices 100 and 100' of FIG. 4A are separated by a single DTI trench region 312 that provides electrical isolation between the two devices 100 and 100'. In this arrangement, device 100' is the first ESD protection device in the stacked arrangement and device 100 is the second ESD protection device.

Again, the cathode 138' of device 100' is connected to the anode 140 of device 100, connecting devices 100 and 100' in series. The anode 140' of device 100' is connected to a first terminal of IC device 300, where IC device 300 is to be protected by the stacked ESD protection device. The cathode 138 of the stacked ESD protection device 100 is connected to a second terminal of IC device 300.

Using the configuration shown in FIGS. 4A and 4B any number of ESD protection devices can be combined, in series, to form an ESD protection clamp. The anode of the first ESD protection device in the stack and the cathode of the last ESD protection device in the stack can then be connected to an IC device to provide protection thereto.

When two or more ESD protection devices are stacked as shown in FIG. 4A or FIG. 4B, the snapback voltage Vh of the entire stacked device is equal to the sum of the snapback voltages of each of individual ESD protection devices 100. As such, to provide a protection device that targets a snapback voltage of 50V, a stack that includes three of the present ESD protection devices connected in series can be used. Because the Vh of each individual ESD protection device is approximately 17.5V, though in other implementations Vh of each individual ESD protection device may vary from 14V to 30V or between 17V and 24V, the targeted value of 50 V can be met with three series-connected devices. This is in contrast to prior ESD protection devices that provide a Vh of only 13V-15V in the same configuration. As a result, when using prior art ESD protection devices, a stack of four devices would be required to meet a 50 V requirement. The number of the ESD protection devices in the stack can range from 1 to any number.

In various implementations, BOX layer 308 of the stacked arrangement is optional and can be removed from the device as the device are insulated using NBL regions 110 and LNBL regions 108. Similarly, DTI regions 106 are also optional, as the ESD devices 100 can be insulated from one another using alternative isolation mechanisms.

The present ESD device has a reduced Ron and Vt2 compared to conventional ESD devices. The reduced Ron of the present ESD device allows for a reduction in size of the ESD device while still meeting performance requirements. In some cases, the present ESD device exhibits a reduced footprint of 20% to 40% compared to conventional devices. Additionally, the device retains bi-directional capability while experiencing reduced Ron for both directions. The present ESD device may also exhibit reduced Vh, leading to improved latch-up immunity.

The reduction in Ron for the present ESD device may also improve the device's performance in a stacked configuration as Ron tends to accumulate with an increase in number in stacked ESD devices.

Figure 5B:
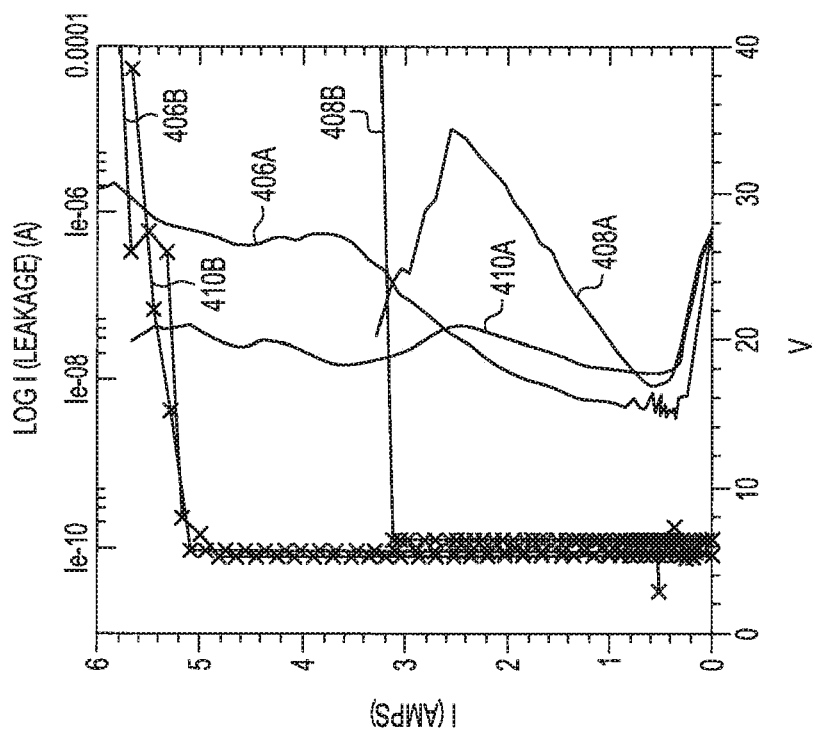
FIGS. 5A and 5B are graphs showing test results for a conventional ESD protection device including a full NBL, a conventional ESD device include a lightly doped NBL, and an ESD protection device configured in accordance with the present disclosure
Figure 5A:
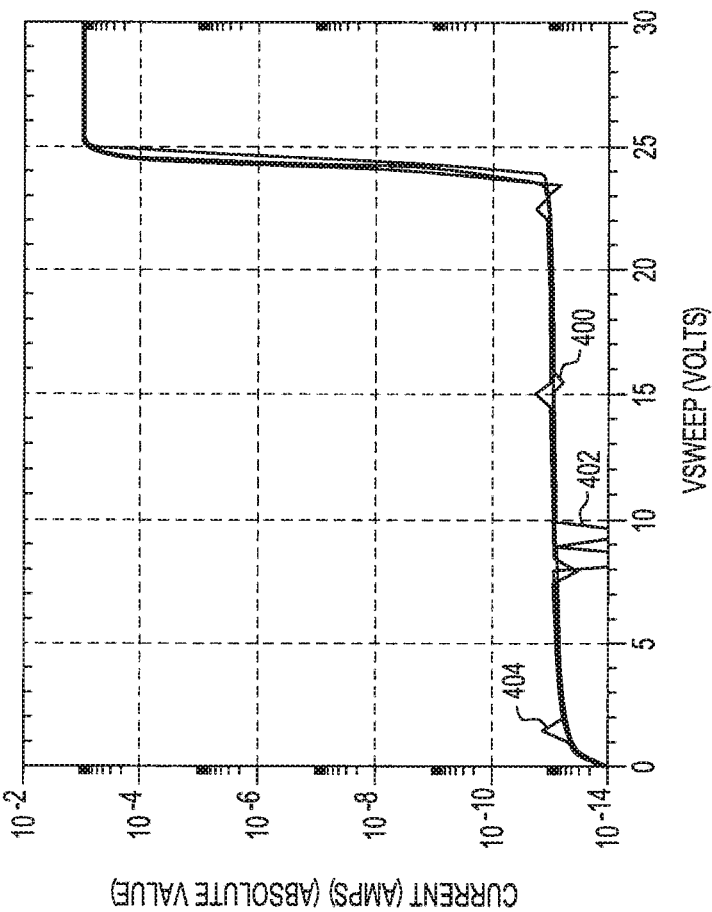

To illustrate, FIGS. 5A and 5B are graphs showing test results for a conventional ESD protection device including a full NBL, a conventional ESD device include a lightly-doped NBL, and an ESD protection device configured in accordance with the present disclosure.

FIG. 5A shows the results of a DC sweep measurement comparing current flow through the three devices. In FIG. 4A line 400 shows the forward DC sweep response of a conventional ESD protection device stack having a full NBL, line 402 shows the forward DC sweep response of an ESD protection device stack having a full lightly-doped NBL, and line 404 shows the forward DC sweep response of an ESD protection device stack configured in accordance with the present disclosure. As shown, all devices have a similar DC breakdown voltage BV of approximately 24V.

FIG. 5B shows the test results of a transmission line pulse (TLP) comparing transient I-V response (406A, 408A, and 410A) as well as the DC leakage current (406B, 408B, and 410B) for the three device stacks in forward polarity. Line 406A shows the TLP I-V response of a conventional ESD protection device stack having a full NBL, line 408A shows the TLP I-V response a conventional ESD protection device stack having a full lightly-doped NBL, and line 410A shows the TLP I-V response of the present ESD protection device stack using a combined NBL and LNBL. As shown, the forward triggering voltages (Vt1) of the devices are comparable. The triggering voltage Vt1 of the conventional device stack having full NBL is approximately 27.5V, the conventional device having a full lightly-doped NBL is approximately 27.1V, and the present device is approximately 26.8V.

In this example, though, the present device stack demonstrates a significantly improved Ron over the conventional devices. In the example shown in FIG. 5B, the Ron of the conventional devices are 2.7 Ohms with a full NBL and 8 Ohms with a full lightly-doped NBL. In contrast, Ron for the present device is 0.71 Ohms, indicating a reduced Ron over conventional devices.

The results depicted in FIGS. 5A and 5B mirror those observed for the devices operating in reverse polarity, indicating that the present device provides symmetrical performance whether operating in forward polarity, or reverse polarity.

In testing, the present ESD device has also demonstrated good stacking capability. Notably, in testing, the device's DC breakdown voltage, Vt1 and Vh have been shown to be approximately the sum of those values for each ESD device within a stacked device. This indicates good predictability in use of the present ESD device in a stacked configuration.

As mentioned above, the improved performance of the present ESD device also enable the manufacture of ESD devices that meet the performance criteria of existing ESD devices, while have a significantly reduced foot print. For example, in one implementation, the reduced Ron of the present ESD device allows for the manufacture of devices have a 20 to 40% reduced footprint, while meeting existing performance requirements.

Although the present disclosure describes specific examples, embodiments, and the like, various modifications and changes can be made without departing from the scope of the present disclosure as set forth in the claims below. For example, although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. An electrostatic discharge protection clamp adapted to limit a voltage appearing across protected terminals of an integrated circuit to which the electrostatic discharge protection clamp is configured to be coupled, comprising:
    a substrate; and
    a first electrostatic discharge protection device over the substrate, the first electrostatic discharge protection device including:
        a buried layer over the substrate, the buried layer having a first region having a first doping concentration and a second region having a second doping concentration, the first doping concentration being greater than the second doping concentration;
        an epitaxial layer over the buried layer, the epitaxial layer having a first conductivity type and including a first epitaxial region and a second epitaxial region;
        a first transistor over the buried layer, the first transistor having an emitter and a base formed in the first epitaxial region, the emitter of the first transistor being configured to coupled to a cathode terminal of the electrostatic discharge protection clamp;
        a second transistor over the buried layer, the second transistor having an emitter and a base formed in the second epitaxial region, the emitter of the second transistor being configured to coupled to an anode terminal of the electrostatic discharge protection clamp; and
        a well region having a second conductivity type opposite the first conductivity type between the first epitaxial region and the second epitaxial region, wherein a collector of the first transistor and a collector of the second transistor are formed within the well region directly over and overlap the first region of the buried layer, the emitter and the base of the first transistor and the emitter and the base of the second transistor are formed directly over and overlap the second region of the buried layer, and the emitter and the base of the first transistor and the emitter and the base of the second transistor do not overlap any portion of the first region of the buried layer having the first doping concentration.

2. The electrostatic discharge protection clamp of claim 1, wherein the second doping concentration is between $1 \times 10^{16}$ $cm^{-3}$ and $5 \times 10^{17}$ $cm^{-3}$.

3. The electrostatic discharge protection clamp of claim 2, wherein the first doping concentration is between $1 \times 10^{18}$ $cm^{-3}$ and $1 \times 10^{19}$ $cm^{-3}$.

4. The electrostatic discharge protection clamp of claim 1, wherein the substrate includes a buried oxide layer.

5. The electrostatic discharge protection clamp of claim 1, wherein at least one of the first transistor and the second transistor includes a bipolar junction transistor.

6. The electrostatic discharge protection clamp of claim 1, including:
    a first doped contact region forming the emitter of the first transistor;
    a second doped contact region forming the base of the first transistor;
    the second doped contact region and the first doped contact region being located in a doped well; and
    wherein the emitter of the first transistor and the base of the first transistor are electrically interconnected to form the cathode terminal of the electrostatic discharge protection clamp and are over the second region of the buried layer.

7. The electrostatic discharge protection clamp of claim 1, including:
    a third doped contact region forming the emitter of the second transistor;
    a fourth doped contact region forming the base of the second transistor; and
    wherein the emitter of the second transistor and the base of the second transistor are electrically interconnected to form the anode terminal of the electrostatic discharge protection clamp and are over the second region of the buried layer.

8. The electrostatic discharge protection clamp of claim 1, including a second electrostatic discharge protection device over the substrate, the second electrostatic discharge protection device being connected to the first electrostatic discharge protection device.

9. The electrostatic discharge protection clamp of claim 8, including a deep trench isolation region between the first electrostatic discharge protection device and the second electrostatic discharge protection device.

10. The electrostatic discharge protection clamp of claim 1, wherein the buried layer includes a third region having the first doping concentration and including a side wall over the third region of the buried layer.

11. A device, comprising:
    a substrate;
    a buried layer over the substrate, the buried layer having a first region having a first doping concentration and a second region having a second doping concentration;
    a first epitaxial region over the buried layer, the first epitaxial region having a first conductivity type;
    a second epitaxial region over the buried layer, the second epitaxial region having the first conductivity type;
    a first transistor having an emitter and a base in the first epitaxial region;
    a second transistor having an emitter and a base in the second epitaxial region; and
    a well region having a second conductivity type opposite the first conductivity type between the first epitaxial region and the second epitaxial region, wherein a collector of the first transistor and a collector of the second transistor are formed within the well region over the first region of the buried layer, and the emitter and the base of the first transistor and the emitter and the base of the second transistor are formed over the second region of the buried layer and do not overlap any portion of the first region of the buried layer having the first doping concentration.

12. The device of claim 11, wherein the second doping concentration is between $1\times10^{16}$ cm$^{-3}$ and $5\times10^{17}$ cm$^{-3}$.

13. The device of claim 12, wherein the first doping concentration is between $1\times10^{18}$ cm$^{-3}$ and $1\times10^{19}$ cm$^{-3}$.

14. The device of claim 11, wherein at least one of the first transistor and the second transistor includes a bipolar junction transistor.

15. The device of claim 11, including:
a first doped contact region forming the emitter of the first transistor;
a second doped contact region forming the base of the first transistor;
the second doped contact region and the first doped contact region being located in a doped well; and
wherein the emitter of the first transistor and the base of the first transistor are electrically coupled to form a cathode terminal of an electrostatic discharge protection clamp and are over the second region of the buried layer.

16. The device of claim 11, including:
a third doped contact region forming the emitter of the second transistor;
a fourth doped contact region forming the base of the second transistor; and
wherein the emitter of the second transistor and the base of the second transistor are electrically coupled to form an anode terminal of an electrostatic discharge protection clamp and are over the second region of the buried layer.

* * * * *